US012787132B2

(12) United States Patent
Hu et al.

(10) Patent No.: US 12,787,132 B2
(45) Date of Patent: Nov. 3, 2026

(54) MICROWAVE OVEN

(71) Applicants: Guangdong Midea White Home Appliance Technology Innovation Center Co., Ltd., Foshan (CN); Midea Group Co., Ltd., Foshan (CN)

(72) Inventors: Jian Hu, Foshan (CN); Chengkai Ye, Foshan (CN); Junfeng Hou, Foshan (CN); Zhixiong Shi, Foshan (CN)

(73) Assignees: Guangdong Midea White Home Appliance Technology Innovation Center Co., Ltd., Foshan (CN); Midea Group Co., Ltd., Foshan (CN)

( * ) Notice: Subject to any disclaimer, the term of this patent is extended or adjusted under 35 U.S.C. 154(b) by 1116 days.

(21) Appl. No.: 17/679,022

(22) Filed: Feb. 23, 2022

(65) Prior Publication Data

US 2022/0183120 A1 Jun. 9, 2022

Related U.S. Application Data

(63) Continuation of application No. PCT/CN2019/124120, filed on Dec. 9, 2019.

(30) Foreign Application Priority Data

Sep. 24, 2019 (CN) ........................ 201910906612.X

(51) Int. Cl.
*H05B 6/66* (2006.01)
*H01J 23/54* (2006.01)
(Continued)

(52) U.S. Cl.
CPC .............. *H05B 6/664* (2013.01); *H01J 23/54* (2013.01); *H05B 6/6426* (2013.01); *H05K 9/0064* (2013.01)

(58) Field of Classification Search
CPC ....... H05B 6/664; H05B 6/6426; H01J 23/54; H05K 9/0064
See application file for complete search history.

(56) References Cited

U.S. PATENT DOCUMENTS 4,356,431 A * 10/1982 Feinberg ................ H05B 6/666 315/105
4,977,301 A 12/1990 Maehara et al.

FOREIGN PATENT DOCUMENTS

CN 200972169 Y * 11/2007
CN 201294143 Y 8/2009
(Continued)

OTHER PUBLICATIONS

International Search Report, International application No. PCT/CN2019/124120, mailed Jun. 22, 2020(16 pages).
(Continued)

*Primary Examiner* — Woody A Lee, Jr.
(74) *Attorney, Agent, or Firm* — Morgan, Lewis & Bockius LLP

(57) ABSTRACT

A microwave oven includes a frequency converter, a magnetron, a first conductor, and a second conductor. A power supply end of the fre-quency converter is connected to a power supply end of the magnetron by means of the first conductor, and a ground end of the frequency converter is connected to a ground end of the magnetron by means of the second conductor. The first conductor and a part of the second conductor are arranged in parallel, and the distance between the first conductor and the part of the second conductor is less than a preset distance. In this way, RE of the microwave oven can be reduced, and the microwave oven can thus meet the EMC standards.

11 Claims, 3 Drawing Sheets

(51) Int. Cl.
*H05B 6/64* (2006.01)
*H05K 9/00* (2006.01)

(56) References Cited

FOREIGN PATENT DOCUMENTS

| | | | | |
|---|---|---|---|---|
| CN | 105253781 | A | * | 1/2016 |
| CN | 206302344 | U | | 7/2017 |
| CN | 107191980 | A | | 9/2017 |
| JP | S 5342254 | U | | 4/1978 |
| JP | S 62117294 | A | | 5/1987 |
| JP | S 63150881 | A | | 6/1988 |
| JP | H 10172749 | A | | 6/1998 |
| JP | 2000195657 | A | | 7/2000 |
| JP | 2004241311 | A | | 8/2004 |
| JP | 2005044765 | A | | 2/2005 |
| JP | 2011159615 | A | | 8/2011 |
| KR | 20100012243 | A | | 2/2010 |

OTHER PUBLICATIONS

Chinese first office action, application No. 201910906612.X, mailed Jun. 8, 2021(10 pages).
Midea Group Co., Ltd., Extended European Search Report and Supplementary Search Report, EP19946955.2, Sep. 14, 2022, 6 pgs.
Midea Group Co., Ltd., Japanese Office Action, JP Patent Application No. 2022-509668, Mar. 22, 2023, 10 pgs.
Midea Group Co., Ltd., Japanese Decision to Grant, JP Patent Application No. 2022-509668, Jul. 4, 2023, 5 pgs.
Midea Group Co., Ltd., WO, PCT/CN2019/124120, Jun. 22, 2020, 4 pgs.
Midea Group Co., Ltd., IPRP, PCT/CN2019/124120, Mar. 15, 2022, 5 pgs.

* cited by examiner

MICROWAVE OVEN

CROSS-REFERENCE TO RELATED APPLICATION

The application is a continuation application of International (PCT) Patent Application No. PCT/CN2019/124120, filed on Dec. 9, 2019, which claims priority to and the benefit of Chinese Patent Application No. 201910906612.X, filed on Sep. 24, 2019, the contents of which are incorporated by reference in its entirety.

TECHNICAL FIELD

The described embodiments relate to the field of electric appliances, and in particular, to a microwave oven.

BACKGROUND

Electromagnetic compatibility (EMC) of the electric appliances is a very important quality index, which is not only related to operational reliability and use safety of the electric appliances, but also affects a normal operation of other equipment and systems. Therefore, the microwave ovens must pass the EMC standards before being released into the market.

During a long period of research and development, inventors of the present disclosure found that the microwave ovens currently on the market are mainly divided into power frequency microwave ovens and variable frequency microwave ovens. The power frequency microwave ovens use commercial frequency transformers to boost voltage, while the variable frequency microwave ovens use frequency conversion technology and convert commercial power into high voltage at high frequencies. The variable frequency microwave ovens use frequency converters to replace the commercial frequency transformers of the power frequency microwave ovens, so that volumes and weights of the microwave ovens have been significantly reduced, and the microwave ovens are widely popular with consumers.

However, a plurality of electronic components are used in the exiting variable frequency microwave ovens due to the arrangement of the frequency converters, resulting in serious EMC problems. For example, severe attenuation vibration is generated at the moment when high current of a switch tube is turned off, and a spike voltage is generated by reverse recovery characteristics of a diode, and both include electromagnetic interference with rich spectrum, which is emitted to a surrounding space through a wiring harness connected to the switch tube or the diode to form Radiated Emission (RE).

SUMMARY

The technical problems to be solved by the present disclosure is how to reduce the RE of the microwave oven to make the microwave oven meet the EMC standards.

In order to solve the above technical problems, a technical solution of the present disclosure may provide a microwave oven. The microwave oven includes a frequency converter, a magnetron, a first conductor, and a second conductor; a power supply end of the frequency converter is connected to a power supply end of the magnetron via the first conductor, and a ground end of the frequency converter is connected to a ground end of the magnetron via the second conductor; the first conductor and a part of the second conductor are arranged in parallel, and a distance between the first conductor and the part of the second conductor is less than a preset distance.

In some embodiments, a housing of the magnetron is grounded, the ground end of the magnetron is connected to the housing of the magnetron, and the ground end of the frequency converter is connected to the housing of the magnetron via the second conductor.

In some embodiments, the second conductor includes a first section, the first section of the second conductor is routed from the ground end of the frequency converter to the power supply end of the frequency converter; and a second section, the ground end of the frequency converter is connected to the second section of the second conductor via the first section of the second conductor, and the second section of the second conductor arranged in parallel to the first conductor.

In some embodiments, the ground end of the frequency converter is grounded, the ground end of the magnetron is connected to a housing of the magnetron, and the housing of the magnetron is connected to the ground end of the frequency converter via the second conductor.

In some embodiments, the second conductor includes a first section, the first section of the second conductor is arranged in parallel to the first conductor; and a second section, the second section of the second conductor is routed from the power supply end of the frequency converter to the ground end of the frequency converter, and the housing of the magnetron is connected to the second section of the second conductor via the first section of the second conductor.

In some embodiments, the housing of the magnetron is arranged with a ground point, and the ground end of the frequency converter is connected to the ground point via the second conductor.

In some embodiments, the power supply end of the magnetron is arranged on a first side of the magnetron, the ground point is arranged on a second side of the magnetron, the ground end of the frequency converter is arranged on a first side of the frequency converter, and the power supply end of is arranged on a second side of the frequency converter; a third side of the magnetron is arranged opposite to the second side of the frequency converter, the first side of the magnetron and the first side of the frequency converter are arranged on a same side, and the second side of the magnetron is arranged opposite to the third side of the magnetron.

In some embodiments, a sleeve is sleeved on the first conductor.

In some embodiments, the first conductor and the second conductor are bound with each other.

In some embodiments, the distance between the first conductor and the part of the second conductor is less than a distance between the power supply end of the frequency converter and the ground end of the frequency converter.

BRIEF DESCRIPTION OF THE DRAWINGS

In order to make the technical solution described in the embodiments of the present disclosure more clearly, the drawings used for the description of the embodiments will be briefly described. Apparently, the drawings described below are only for illustration but not for limitation. It should be understood that, one skilled in the art might acquire other drawings based on these drawings, without paying any creative efforts.

DETAILED DESCRIPTION

Technical solutions of the embodiments of the present disclosure may be described in detailed by referring to accompanying figures of the embodiments. Obviously, embodiments to be described are only a part of, but not all of, the embodiments of the present disclosure. Any ordinary skilled person in the art may obtain other embodiments without any creative work, and the other embodiments should be included in the scope of the present disclosure.

In order to suppress the RE of the microwave oven, a magnetic ring is usually applied to the microwave oven by an ordinary skilled person in the art. In this way, the RE is shielded via the magnetic ring, so as to reduce leakage. However, material cost and production cost of the magnetic ring are higher, and a shield effect of the magnetic ring on the RE is not obvious, which cannot suppress full-band electromagnetic wave. Meanwhile, disturbance characteristics of the microwave ovens with different batches are various due to different types, and it may be necessary to make different magnetic rings according to the RE test, thus technical versatility is low.

Figure 1:
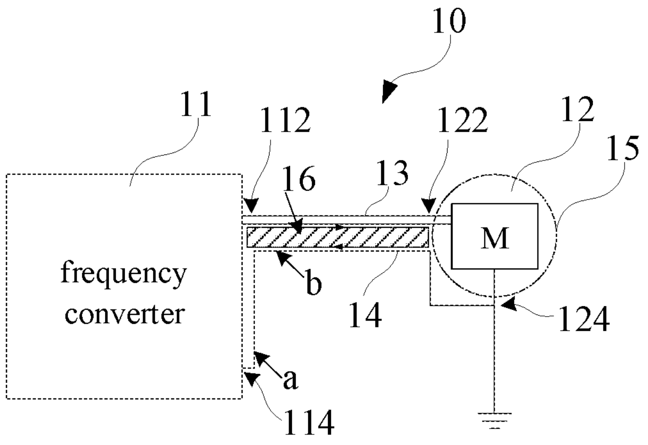
FIG. 1 is a structural view of a microwave oven according to some embodiments of the present disclosure.

Therefore, in some embodiments of the present disclosure, a microwave oven is provided, the microwave oven has high versatility and low cost, and the RE of the microwave oven is very small, which can meet the EMC standards. As shown in FIG. 1, FIG. 1 is a structural view of the microwave oven according to some embodiments of the present disclosure. In some embodiments, the microwave oven 10 includes a frequency converter 11, a magnetron 12, a first conductor or conductive wire 13, and a second conductor or conductive wire 14. A power supply end 112 of the frequency converter 11 is connected to a power supply end 122 of the magnetron 12 via the first conductor 13, and a ground end 114 of the frequency converter 11 is connected to a ground end 124 of the magnetron 12 via the second conductor 14. The first conductor 13 and a part of the second conductor 14 are arranged in parallel, and a distance between the first conductor 13 and the part of the second conductor 14 is less than a preset distance.

In some embodiments, the frequency converter 11 may be a single-phase, a triple-phase, a high frequency converter, a general frequency converter, or the like. The frequency converter 11 at least includes a rectifier (not shown), a filter (not shown), an inverter (not shown). The frequency converter 11 is configured to provide to a power change of a power supply for voltage regulation and frequency modification, so that the frequency converter 11 outputs electrical energy of different values to the magnetron 12, and the magnetron 12 is driven to output microwaves of different energy levels. In this way, the microwave oven 10 may output powers of different sizes according to environmental conditions or users' needs, thus achieving the purpose of energy saving.

The magnetron 12 is configured for generation and emission of microwave energy during a heating process of the microwave oven 10. In these embodiments, the magnetron 12 may be a continuous-wave magnetron, pulse-wave magnetron, or the like. The magnetron 12 at least includes an antenna (not shown), a cathode (not shown), and an anode (not shown). Further, the cathode used as a power supply end is configured to obtain electrical signals from the power supply end of the frequency converter 11 and emit electrons to the anode. The electrons are received by the anode to generate an anode current, and the power is further transmitted to the antenna. In this way, the antenna sends the microwaves to the microwave oven 10, so that food in the microwave oven can be heated.

The power supply end 122 of the magnetron 12 is the cathode of the magnetron 12, therefore, the first conductor 13 is usually referred to as a cathode wire. In these embodiments, the first conductor 13 includes two cathode wires (not shown). The second conductor 14 is a ground wire, and is configured to connect the ground end 114 of the frequency converter 11 to the ground end 124 of the magnetron 12. The anode of the magnetron 12 is connected to the ground end 124 of the magnetron 12.

In an application scenario, a voltage between the two cathode wires of the magnetron 12 is 3.3V, and configured to heat the magnetron 12, so that the electrons can be excited more easily. Further, a voltage between the cathode wire and the ground end 124 of the magnetron 12 is 4 kV, and con ured to convert the electrical energy into the microwave energy.

According to an antenna theory, a closed loop with current flowing through can emit electromagnetic energy to the surrounding space due to an antenna effect. A radiated power can be regarded as a power loss of the current in a resistance, and the resistance is called as a radiation resistance (which represents an ability to radiate the electromagnetic energy), that is to say, $P=I^2*Rrad$, where P is a total radiation power of the antenna, I is a feed current of the antenna, and Rrad is the radiation resistance. Further, the larger the Rrad, the stronger the antenna radiation capacity. When a circumference (C) of the antenna is less than or equal to 5λ, ($C<5\lambda$), the radiation resistance (Rrad) is equal to $320\pi^4*S^2/\lambda^4$, where λ is a wavelength corresponding to an electromagnetic frequency, and S is an area of the antenna.

For the microwave oven 10, an electromagnetic frequency band of the RE is about 30 MHz to 1 GHz. The closed loop in the microwave oven 10 basically meets requirements of the circumference of the antenna as described above. Therefore, the larger the area of the closed loop, the stronger the ability to radiate the electromagnetic energy. A largest closed loop in the microwave oven 10 is formed by the cathode wire and the ground wire, that is to say, the closed loop 16 formed by the first wire 13 and the second wire 14.

During a long period of research and development, inventors of the present disclosure found that there is a long distance between the frequency converter 11 and the magnetron 12 in a hardware configuration of the microwave oven 10, so that there is a great distance between the ground end 114 of the frequency converter 11 and the ground end 124 of the magnetron 12, and there is also a long distance between the power supply end 112 of the frequency converter 11 and the ground end 114 of the frequency converter 11. Based on the hardware configuration, if the ground end 114 of the frequency converter 11 and the ground end 124 of the magnetron 12 are grounded closely or nearby, an area of a closed loop 20 formed by the cathode wire and the ground wire will be larger, and the microwave oven 10 has a stronger ability to radiate electromagnetic energy into space, as shown in FIG. 2.

Figure 2:
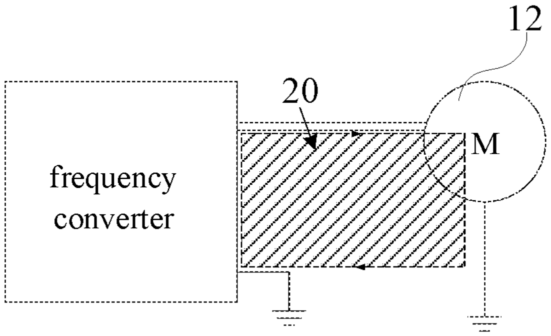
FIG. 2 is a structural view of a microwave oven.

Compared with the largest closed loop 20 in the microwave oven as shown in FIG. 2, the area of the largest closed loop 16 in the microwave oven 10 in the embodiments of FIG. 1 is significantly reduced.

Therefore, in these embodiments, the first conductor 13 used as the cathode wire and the second conductor 14 used as the ground wire are arranged in parallel. In this way, the distance between the cathode wire and the ground wire is reduced, so as to reduce the area of the closed loop 16 formed by the cathode wire and the ground wire, so that the RE of the microwave oven 10 is reduced, thus making the microwave oven 10 meet the EMC standards.

Referring to FIG. 1, in these embodiments, the second conductor 14 includes a first section a and a second section b, the ground end 114 of the frequency converter 11 is connected to the second section b of the second conductor 14 via the first section a of the second conductor 14, the first section a of the second conductor 14 is routed from the ground end 114 of the frequency converter 11 to the power supply end 112 of the frequency converter 11, and the second section b of the second conductor 14 is arranged in parallel to the first conductor 13.

Furthermore, a distance between the first conductor 13 and the part of the second conductor 14, that is, between the first conductor 13 and the second section b of the second conductor 14, is less than a distance between the power supply end 112 of the frequency converter 11 and the ground end 114 of the frequency converter 11.

In this way, it is possible to reduce a distance between a current path, between the power supply end 112 of the frequency converter 11 in the closed loop 16 and the power supply end 122 of the magnetron 12, and a current path, between the ground end 114 of the frequency converter 11 and the ground end 124 of the magnetron 12, thus reducing the area of the closed loop 16.

In some embodiments, in order to reduce the distance between the first conductor 13 and the second section b of the second conductor 14 as much as possible, the first conductor 13 and the second conductor 14 may be bound with each other via a lace (not shown) or a sleeve (not shown). It should be understood that, in other embodiments, the first conductor and the second conductor may be bound with each other via other ways, such as by means of pasting, and the like.

In some embodiments, in order to prevent an insulation layer outside the first conductor 13 and/or an insulation layer outside the second conductor 14 from being worn or cracked, which may cause a short circuit between the first conductor 13 and the second conductor 14, a sleeve (not shown) may be further sleeved on a periphery of the first conductor 13.

In these embodiments, the ground end 114 of the frequency converter 11 is connected to the ground end 124 of the magnetron 12, and the ground end 124 of the magnetron 12 is grounded.

Figure 3:
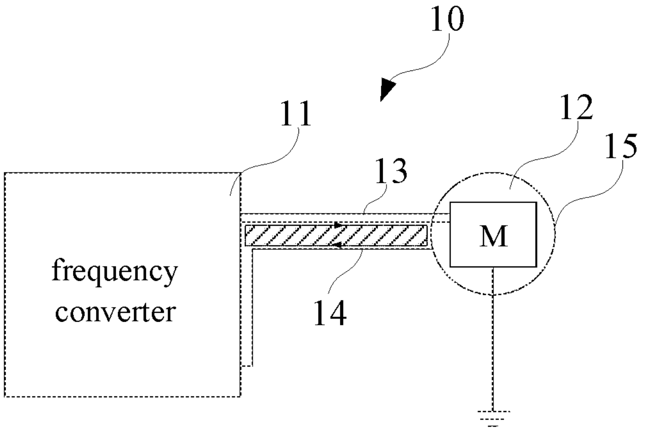
FIG. 3 is a structural view of a microwave oven according to some embodiments of the present disclosure.

In other embodiments, as shown in FIG. 3, a difference between the microwave oven 10 of these embodiments and the microwave oven 10 as shown in FIG. 1 is that the ground end 124 of the magnetron 12 is connected to a housing 15 of the magnetron 12, the ground end 114 of the frequency converter 11 is connected to the housing 15 of the magnetron 12 via the second conductor 14, and the housing 15 of the magnetron 12 is connected to a case (not shown) of the microwave oven 10 so as to be grounded.

In this way, the second conductor 14 may be connected closely to the housing 15 of the magnetron 12, so as to reduce a length of the second conductor 14.

Figure 4:
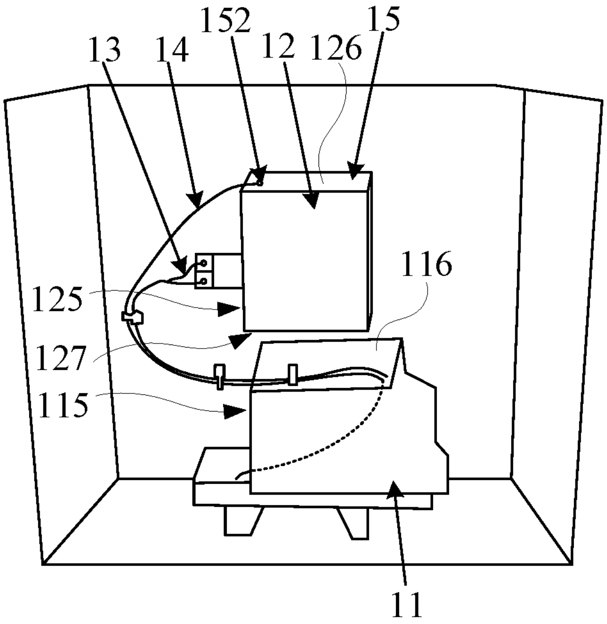
FIG. 4 is a structural view of a microwave oven according to some embodiments of the present disclosure.

In other embodiments, as shown in FIG. 4, a difference between the microwave oven 10 of these embodiments and the microwave oven 10 as shown in FIG. 3 is that the housing 15 of the magnetron 12 is arranged with a ground point 152 and the ground end 114 of the frequency converter 11 is connected to the ground point 152 via the second conductor 14.

In some embodiments, the power supply end 122 of the magnetron 12 is arranged on a first side 125 of the magnetron 12, and the ground point 152 is arranged on a second side 126 of the magnetron 12. The ground end 114 of the frequency converter 11 is arranged on a first side 115 of the frequency converter 11, and the power supply end 112 of the frequency converter 11 is arranged on a second side 116 of the frequency converter 11. Furthermore, a third side 127 of the magnetron 12 is arranged opposite to the second side 116 of the frequency converter 11, the first side 125 of the magnetron 12 and the first side 115 of the frequency converter 11 are arranged on a same side, and the second side 116 of the magnetron 11 is arranged opposite to the third side 127 of the magnetron 12.

Figure 5:
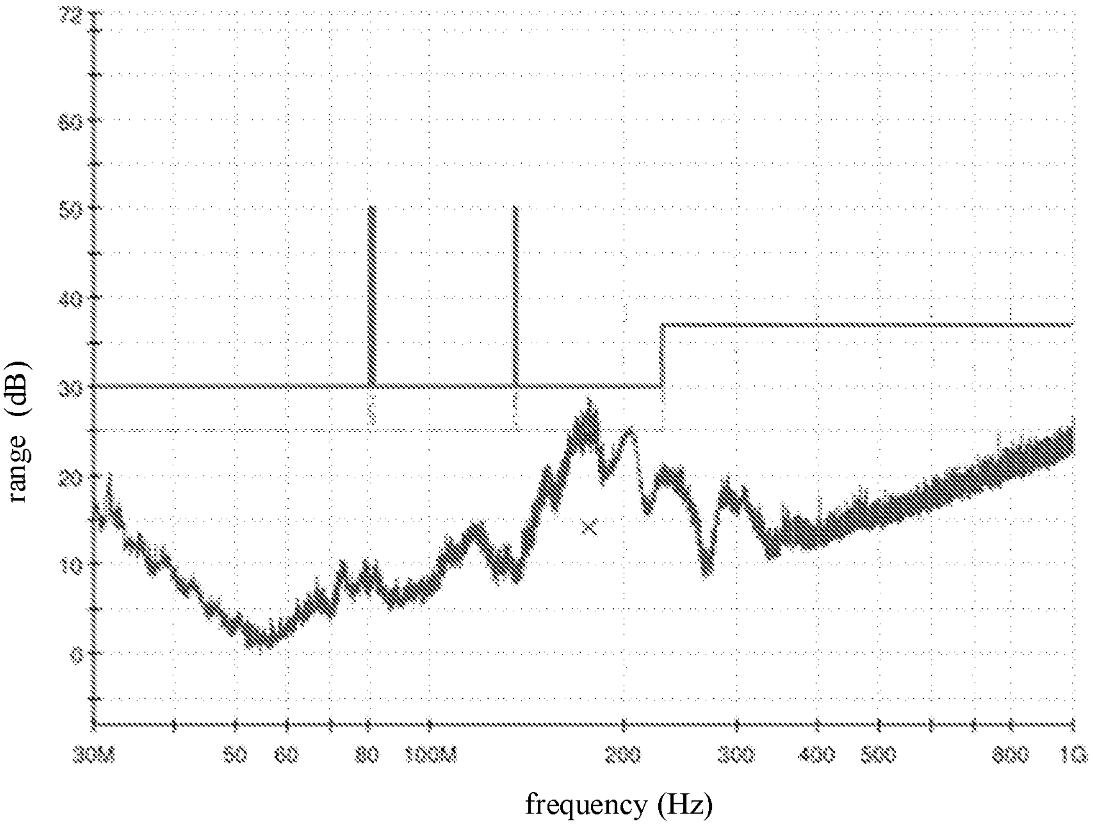
FIG. 5 is a view of RE test results of the microwave oven in embodiments of FIG. 4.
Figure 6:
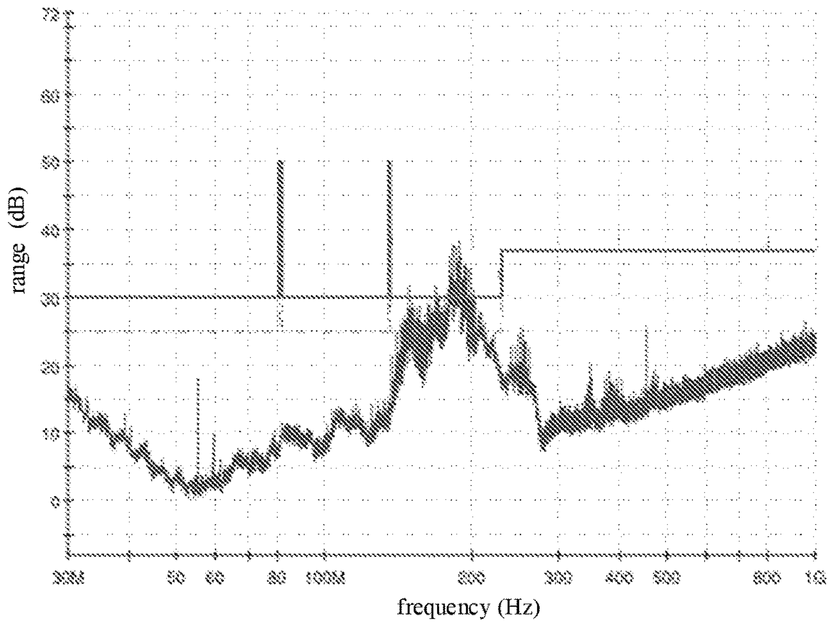
FIG. 6 is a view of RE test results of the microwave oven as shown in FIG. 2.

As shown in FIGS. 5 and 6, FIG. 5 is a view of the RE test results of the microwave oven in the embodiments of FIG. 4, and FIG. 6 is a view of RE test results of the microwave oven as shown in FIG. 2. Obviously, it should be found that the RE of the microwave oven 10 of these embodiments is significantly reduced compared to a technical solution that the ground end of the frequency converter is connected directly to the ground and the ground end of the magnetron is connected directly to the ground.

In some embodiments, it should be understood that each pin of the magnetron and each pin of the frequency converter can also have other setting locations, and the magnetron and the frequency converter can also have other relative position relationships, which will not be repeated here.

Figure 7:
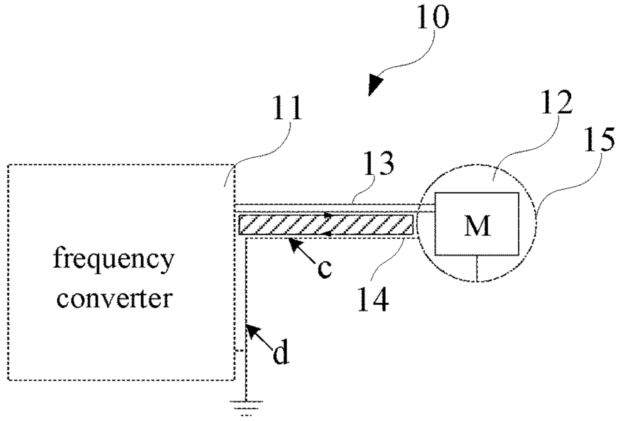
FIG. 7 is a structural view of a microwave oven according to some embodiments of the present disclosure.

In other embodiments, as shown in FIG. 7, a difference between the microwave oven 10 of these embodiments and the microwave oven 10 as described above is that the ground end 114 of the frequency converter 11 is grounded, the ground end 124 of the magnetron 12 is connected to the housing 15 of the magnetron 12, and the housing 15 of the magnetron 12 is connected to the ground end 114 of the frequency converter 11 via the second conductor 14.

In some embodiments, the second conductor 14 includes a first section c and a second section d, and the housing 15 of the magnetron 12 is connected to the second section d of the second conductor 14 via the first section c of the second conductor 14, the second section d of the second conductor 14 is routed from the power supply end 112 of the frequency converter 11 to the ground end 114 of the frequency converter 11, and the first section c of the second conductor 14 is arranged in parallel to the first conductor 13.

Figure 8:
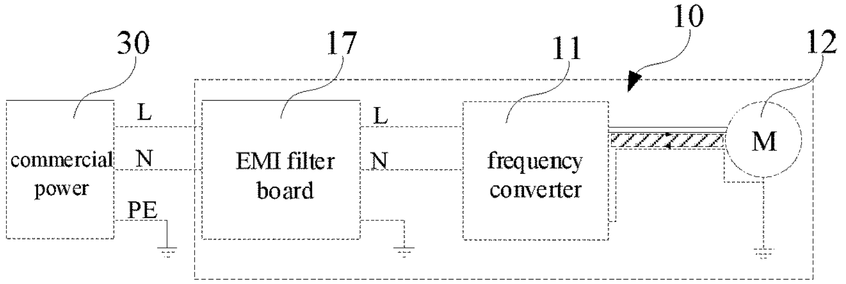
FIG. 8 is a structural view of a microwave oven according to some embodiments of the present disclosure.

In other embodiments, as shown in FIG. 8, based on the microwave oven 10 in the embodiments of FIG. 1, the microwave oven 10 in these embodiments further include an Electro Magnetic Interference (EMI) filter board 17. Further, an input end of the EMI filter board 17 is connected to the commercial power 30, an output end of the EMI filter board 17 is connected to an input end of the frequency converter 11, and the EMI filter board 17 is configured to filter the commercial power 30 to filter out high-frequency interference in the commercial power 30, and the like.

After the commercial power 30 is supplied to the power supply, the commercial power 30 firstly passes through the EMI filter board 17. The EMI filter board 17 is mainly configured to filter the interference of high-frequency pulses of an external power grid to the power supply, and reduce the electromagnetic interference of the power supply to the outside world at the same time.

The EMI filter board 17 may be implemented as capacitors and inductors.

Different from the related art, the microwave oven 10 according to some embodiments of the present disclosure includes the frequency converter 11, the magnetron 12, the first conductor 13, and the second conductor 14. The power supply end 112 of the frequency converter 11 is connected to the power supply end 122 of the magnetron 12 via the first conductor 13, and the ground end 114 of the frequency converter 11 is connected to the ground end 124 of the magnetron 12 via the second conductor 14. The first conductor 13 and the part of the second conductor 14 are arranged in parallel, and the distance between the first conductor 13 and the part of the second conductor 14 is less than the preset distance. In this way, the first conductor 13 as the cathode wire and the part of the second conductor 14 as the ground wire are arranged in parallel in some embodiments of the present disclosure, so as to reduce a distance between the cathode wire and the ground wire, and then reduce the area of the closed loop 16 formed by the cathode wire and the ground wire, thus reducing the RE of the microwave oven 10 to make the microwave oven 10 meet the EMC standards.

The above are only embodiments of the present disclosure and are not intended to limit the scope of the present disclosure. Any equivalent structural changes made under the concept of the present disclosure, using the contents of the specification of the present disclosure and the accompanying drawings, or applied directly/indirectly in other related fields of technology are included in the scope of protection of the present disclosure.

What is claimed is:

1. A microwave oven, comprising:

a frequency converter;

a magnetron;

a first conductor, wherein a power supply end of the frequency converter is connected to a power supply end of the magnetron via the first conductor; and a second conductor, wherein a ground end of the frequency converter is connected to a ground end of the magnetron via the second conductor, wherein the first conductor and a part of the second conductor are arranged in parallel, and a distance between the first conductor and the part of the second conductor between the power supply end of the magnetron and the power supply end of the frequency converter is less than a distance between the power supply end of the frequency converter and the ground end of the frequency converter.

2. The microwave oven as claimed in claim 1, wherein a housing of the magnetron is grounded, the ground end of the magnetron is connected to the housing of the magnetron, and the ground end of the frequency converter is connected to the housing of the magnetron via the second conductor.

3. The microwave oven as claimed in claim 2, wherein the second conductor comprises:

a first section, wherein the first section of the second conductor is routed from the ground end of the frequency converter to the power supply end of the frequency converter; and a second section, wherein the ground end of the frequency converter is connected to the second section of the second conductor via the first section of the second conductor, and the second section of the second conductor is arranged in parallel to the first conductor.

4. The microwave oven as claimed in claim 1, wherein the ground end of the frequency converter is grounded, the ground end of the magnetron is connected to a housing of the magnetron, and the housing of the magnetron is connected to the ground end of the frequency converter via the second conductor.

5. The microwave oven as claimed in claim 2, wherein the housing of the magnetron is arranged with a ground point, and the ground end of the frequency converter is connected to the ground point via the second conductor.

6. The microwave oven as claimed in claim 5, wherein the power supply end of the magnetron is arranged on a first side of the magnetron, the ground point is arranged on a second side of the magnetron, the ground end of the frequency converter is arranged on a first side of the frequency converter, and the power supply end is arranged on a second side of the frequency converter; and wherein a third side of the magnetron is arranged opposite to the second side of the frequency converter, the first side of the magnetron and the first side of the frequency converter are arranged on a same side, and the second side of the magnetron is arranged opposite to the third side of the magnetron.

7. The microwave oven as claimed in claim 1, wherein a sleeve is sleeved on the first conductor.

8. The microwave oven as claimed in claim 1, wherein the first conductor and the second conductor are bound with each other.

9. The microwave oven as claimed in claim 1, wherein the first conductor and the second conductor form a closed loop between the frequency converter and the magnetron.

10. The microwave oven as claimed in claim 1, wherein the microwave oven further comprises an Electro Magnetic Interference (EMI) filter board.

11. The microwave oven as claimed in claim 10, wherein an input end of the EMI filter board is connected to a power supply, an output end of the EMI filter board is connected to an input end of the frequency converter, and the EMI filter board is configured to filter out high-frequency interference from the power supply.

* * * * *